United States Patent
Moser et al.

(10) Patent No.: US 7,636,376 B2
(45) Date of Patent: Dec. 22, 2009

(54) METHOD AND APPARATUS FOR WAVELENGTH TUNING LASER DIODES

(75) Inventors: Christophe Moser, Pasadena, CA (US); Frank Havermeyer, Arcadia, CA (US); Lawrence Pokwah Ho, Arcadia, CA (US)

(73) Assignee: Ondax, Inc., Monrovia, CA (US)

( * ) Notice: Subject to any disclaimer, the term of this patent is extended or adjusted under 35 U.S.C. 154(b) by 99 days.

(21) Appl. No.: 12/154,636

(22) Filed: May 23, 2008

(65) Prior Publication Data

US 2009/0238217 A1 Sep. 24, 2009

Related U.S. Application Data

(60) Provisional application No. 61/070,406, filed on Mar. 21, 2008.

(51) Int. Cl.
*H01S 3/10* (2006.01)
*H01S 3/08* (2006.01)

(52) U.S. Cl. ............ 372/20; 372/21; 372/101; 372/102

(58) Field of Classification Search .............. 372/20, 372/21, 99, 101, 102
See application file for complete search history.

(56) References Cited

U.S. PATENT DOCUMENTS

| | | | |
|---|---|---|---|
| 4,942,583 | A | 7/1990 | Nazarathy et al. |
| 5,594,744 | A | 1/1997 | Lefevre et al. |
| 5,691,989 | A | 11/1997 | Rakuljic et al. |
| 7,298,771 | B2 | 11/2007 | Volodin et al. |

OTHER PUBLICATIONS

Tunable Lasers Handbook—tunable external-cavity semi-conductor lasers, P. Zorabedian, chapter 8, Academic Press 1995.
Herwig Kogelnik, Coupled Wave Theory for Thick Hologram Gratings, The Bell System Tech. Journal, Nov. 1969, vol. 48, No. 9, pp. 2909-2947.

*Primary Examiner*—Armando Rodriguez

(57) ABSTRACT

A method is presented for shaping the spectral response of volume holographic grating elements by applying controlled thermal energy. The methods allow generating continuous or discontinuous grating periods from a fixed grating period. The methods are applicable to optical feedback into optical sources such as light emitting diodes, lasers and other general optical filtering applications.

41 Claims, 16 Drawing Sheets

METHOD AND APPARATUS FOR WAVELENGTH TUNING LASER DIODES

RELATED APPLICATION

This patent application claims priority to provisional patent application 61/070,406 filed on Mar. 21, 2008 and incorporated by reference herein in its entirety.

BACKGROUND OF THE INVENTION

1. Field of the Invention

The present invention relates to methods and apparatus for tuning the wavelength of laser diodes with an external cavity. An ultra-narrow band volume holographic grating is the filtering element of the cavity. The body of the present invention specifically relates to tunable lasers that are self-aligned.

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

2. Background Art

It is known that an optical cavity selects one or more wavelengths emitted by a laser amplifier medium. The well known Fabry-Perot cavity comprises two mirrors, one of which is partially transparent. The Fabry-Perot cavity is used for low power laser diodes (tens of mW) as well as high power (tens of Watts) laser diodes. Fabry-Perot cavities resonates at discrete wavelengths. These discrete wavelengths are obtained when an integer number of wavelengths equal one cavity round trip. Because the discrete wavelengths are closely spaced, multiple wavelengths are likely to be amplified by the wide spectrum amplifier medium. The resulting laser is called multimode longitudinal laser.

For certain applications, either a single mode longitudinal laser is required or a reduction in the number of longitudinal modes is beneficial especially for high power multimode lateral laser diodes. It is then necessary to implement a resonant external cavity which includes an additional mean to select the wavelength or group of wavelengths within the Fabry-Perot cavity.

There are numerous external cavity semi-conductor lasers (ECL) apparatus that have been presented in the scientific literature and which have found commercial success over the years. A review of the different architectures for ECL can be found in the "Tunable Lasers Handbook—tunable external-cavity semi-conductor lasers" by P. Zorabedian, chapter 8, Academic Press 1995. The background art for the present invention is related to tunable laser architectures that are self-aligned:

U.S. Pat. No. 5,594,744 discloses an external cavity semi-conductor laser with a self-aligned cavity. FIG. 1 illustrates the prior art. Laser diode 100 is collimated by lens 120. A dispersive grating 140 intercepts the collimated beam and disperse the wavelength angularly into mainly the first order. A retro-reflector prism 130 oriented in a direction orthogonal to the dispersion plane reflects the first order dispersed beam. Because the reflected beam by the retro-reflector 130 has the same direction as the incident beam, the system formed by the dispersive grating and the retro-reflector form a self-aligned filter that send the filtered wavelength back into the laser diode 100.

U.S. Pat. No. 4,942,583 discloses an external cavity semi-conductor laser with a self-aligned cavity. FIG. 2 illustrates the prior art. Laser diode 200 is collimated by lens 220. An interference filter 240 is placed in the path of the collimated beam. By tuning the angle of incidence of the interference filter, the center wavelength can be changed. Lens 260 focuses the collimated beam onto mirror 280 which reflects the light path back into the laser diode 200. This architecture is insensitive to angular tilt and lateral displacement. This laser cavity of this architecture is called degenerate as they are multiple sets of angles and laser spatial location for the laser cavity to be stable.

U.S. Pat. Nos. 5,691,989 and 7,298,771 disclose the use of volume holographic gratings (VHG) as spectrally selective reflectors as one of the mirrors in the external cavity. The volume holographic gratings described in the patents above are not dispersive and not to be confused with the dispersive gratings disclosed in the prior art of U.S. Pat. No. 5,594,744. VHGs filter light by using the Bragg effect. VHGs are well known optical elements described for example in Kogelnick, "Coupled wave theory for thick hologram gratings," Bell Syst. Tech. J. 48, 2909-2947 (1969). FIG. 3 illustrates the prior art architecture of a tunable laser employing a VHG. laser diode 300 is collimated by lens 320. A reflective (or transmissive) VHG 340 is positioned at an angle in the path of the collimated beam. The diffracted (filtered) beam is directed toward a mirror 360 forming a right angle with the VHG. Mirror 380 retro-reflect the beam path back into the diode 300. By varying the angle of VHG 340 the diffracted (filtered) wavelength is changed accordingly. The tunable external cavity is sensitive to angle changes of mirror 380. Only one specific angle of mirror 380, oriented such that the normal of the mirror is exactly parallel to the incoming beam, will feedback light into the diode 300.

SUMMARY OF THE INVENTION

The invention disclosed here teaches methods for self-aligning and tuning external cavities containing VHGs as the wavelength selective element. From the prior art it is known that only a very specific angle of the VHG will retro-reflect the filtered light back in the cavity of the laser diode.

This invention discloses methods for feedback into an amplifier medium that are insensitive to the VHG angle. FIG. 4 illustrates one embodiment of the invention. The external cavity in FIG. 4 is of degenerate type and contains a VHG. The collimated light from the Fabry-Perot laser diode 400 is incident on a reflective VHG. By adding a mirror 420 adjacent to the laser diode facet, positioned at the same focal plane, it is now possible to intentionally misalign the VHG so that the first diffracted (filtered) light bounces off the said mirror. Because the mirror is placed one focal length away from the collimating lens 430, the first diffracted light is re-collimated with the same angle as the first diffracted light but traveling in opposite direction. The VHG re-diffracts the first diffracted beam to generate a second diffracted beam that is exactly counter-propagating with respect to the first collimated, unfiltered, beam. The second diffracted beam is thus self-fed into the laser cavity. Because the area of the adjacent mirror 420 can be made much larger than the area of the laser diode facet (e.g. 1 mm versus 1 micrometer), the angular sensitivity of the VHG with this degenerate cavity is one thousand times less sensitive than the prior art external cavity containing a VHG.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

In the following description of the present invention, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The methods disclosed below can be applied to more than one laser diode, for example with an array or stack of array of laser diodes such as commercially available high power laser diode bars and stacks. Furthermore, the laser diodes can be spatially single mode or spatially multimode, spectrally single mode or multimode or be of edge emitting or surface emitting type. For purpose of clarity, the embodiment refers to a laser diode with the understanding that it can be any of the above.

Figure 4:
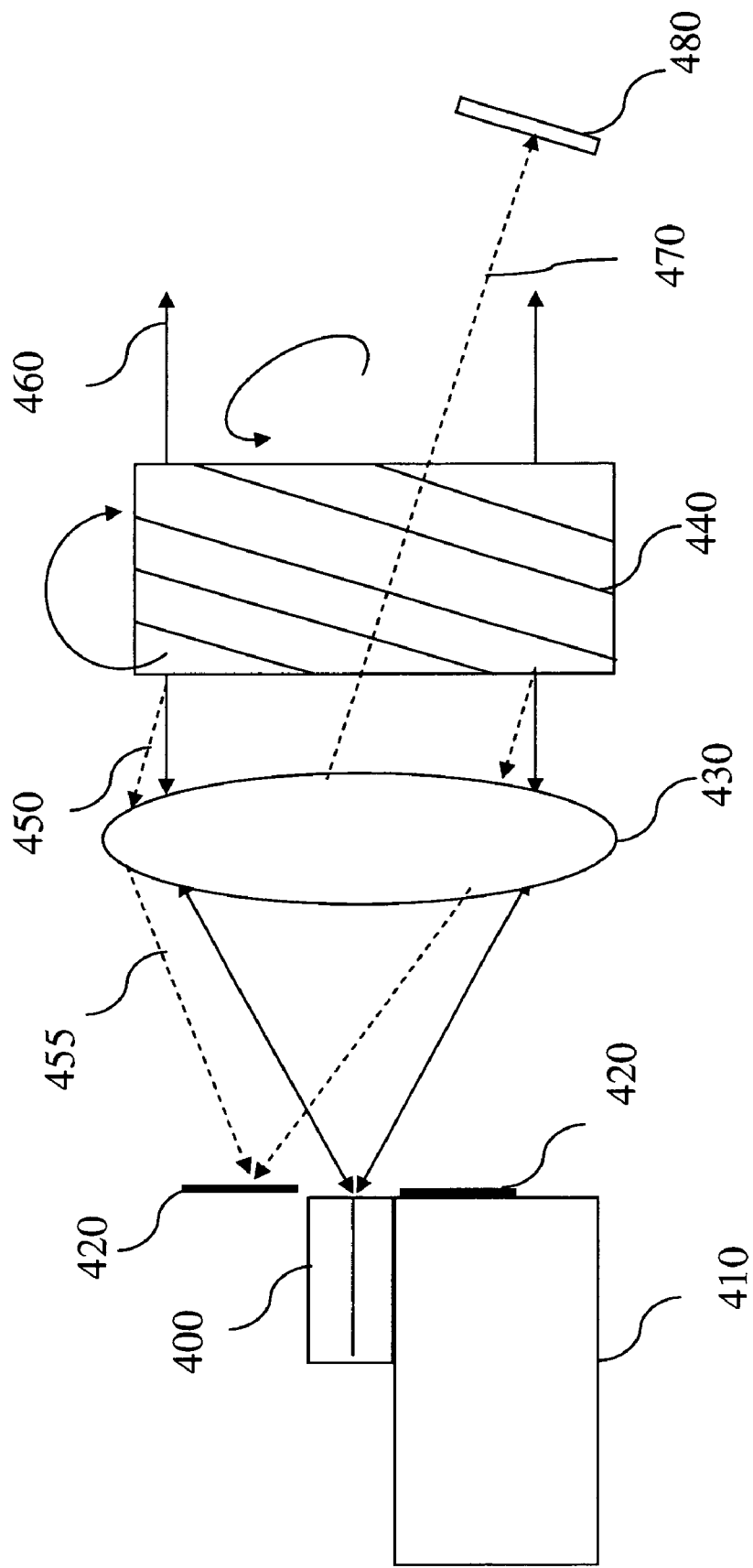
FIG. 4: Schematic of a tunable laser apparatus containing a VHG in a self-aligned degenerate cavity with a mirror adjacent to the laser emission facet.

FIG. 4 is a schematic diagram of one embodiment of tunable laser with a VHG in a degenerate self-aligned cavity. A laser diode 400 rests on a sub-carrier mount 410. The light emitted from the laser diode is first collimated by a single lens or lens assembly 430 to provide a first collimated beam. A reflective VHG 440 is positioned in the path of the said collimated beam so as to diffract (filter) said first collimated beam in a direction which makes a small angle with said first collimated beam. The efficiency of the VHG can be chosen to be high or low depending on the feedback level sought. The part of the beam that is not diffracted goes through the VHG and forms a first output beam 460 of the cavity. The first diffracted beam is focused by the lens or lens assembly 430. Because the first diffracted beam makes a small angle with respect to the first collimated un-diffracted beam, the first diffracted beam comes in focus at the focal plane of the lens assembly 430 at a spatial location away from the emission facet of the laser diode 400. A mirror 420, which can be planar or which can have the curvature of the focal "plane" is placed adjacent to the laser diode emission facet 400 at a distance equal to the focal length from the lens assembly 430. Upon reflection from the mirror 420, the first diffracted beam is re-collimated by the lens assembly 430 providing a second collimated beam propagating in a direction opposite to the first diffracted beam. The second collimated beam is re-diffracted by the VHG 440, providing a second diffracted beam that is propagating in a direction opposite to the first collimated beam and providing a second output beam 470. A photodetector 480 maybe positioned in the path of the second output beam to receive output beam 470. The electrical signal generated from the photodetector maybe used for controlling the emission characteristics of the external cavity laser. For example the signal can be used to control the cavity length via a piezo-electric actuator (not shown) mounted on the VHG or in combination with the temperature and the current of the laser diode.

Figure 10:
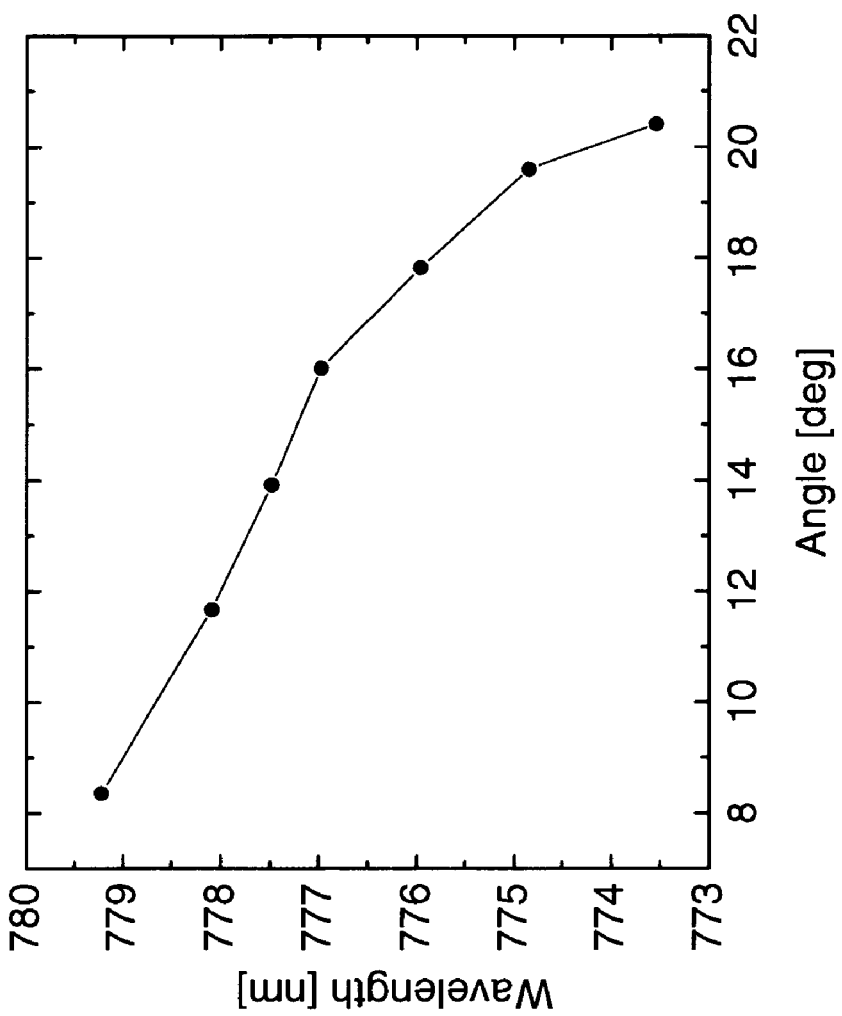
FIG. 10: Graph showing wavelength tuning versus angle change in the laser cavity of FIG. 6.

Tunability is achieved by rotating the VHG in either of two ways. In a first embodiment the VHG is rotated around an axis approximately perpendicular to the plane formed by the direction of the first collimated beam and the grating vector. In a second embodiment, the VHG, whose grating vector makes an angle with respect to the direction of the first collimated beam, is rotated around any axis going through the point formed by the intersection of the grating vector and the direction of the first collimated beam. Two axis of rotation will not tune the wavelength, namely the grating vector axis and the direction of the first collimated beam. It is well known that the wavelength of the diffracted beam depends on the angle of incidence. Both methods of rotation disclosed change the angle of incidence and therefore the diffracted wavelength. The tuning range is limited by the aperture of the lens assembly 430 and the lateral dimension of the mirror 420. A tuning range of 5 nm was achieved with this architecture (FIG. 10). The laser cavity of FIG. 4 is called degenerate because the effective feedback into the cavity is insensitive to angular change and spatial motion of the VHG 440 and mirror 420.

Figure 5:
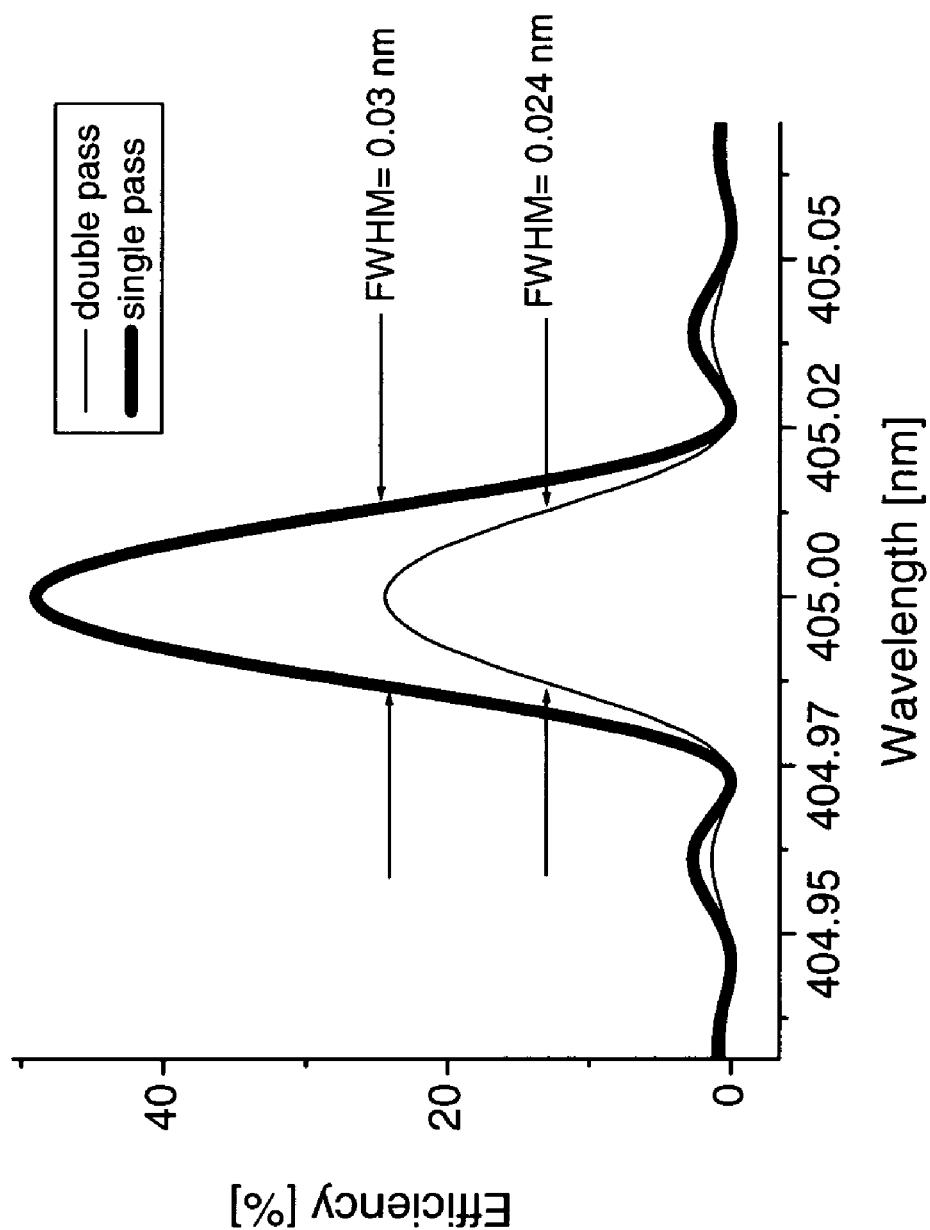
FIG. 5: Graph of the spectral filter shape of a VHG used in a double pass configuration.

FIG. 5 is a graph representing the filter shape of a reflective VHG. The single pass filter shape refers to the spectral shape of the first diffracted beam in FIG. 4. The double pass filter shape refers to the spectral shape of the second diffracted beam in FIG. 4. Upon a second pass the filter bandwidth decreases from 0.03 nm to 0.024 nm.

Figure 1:
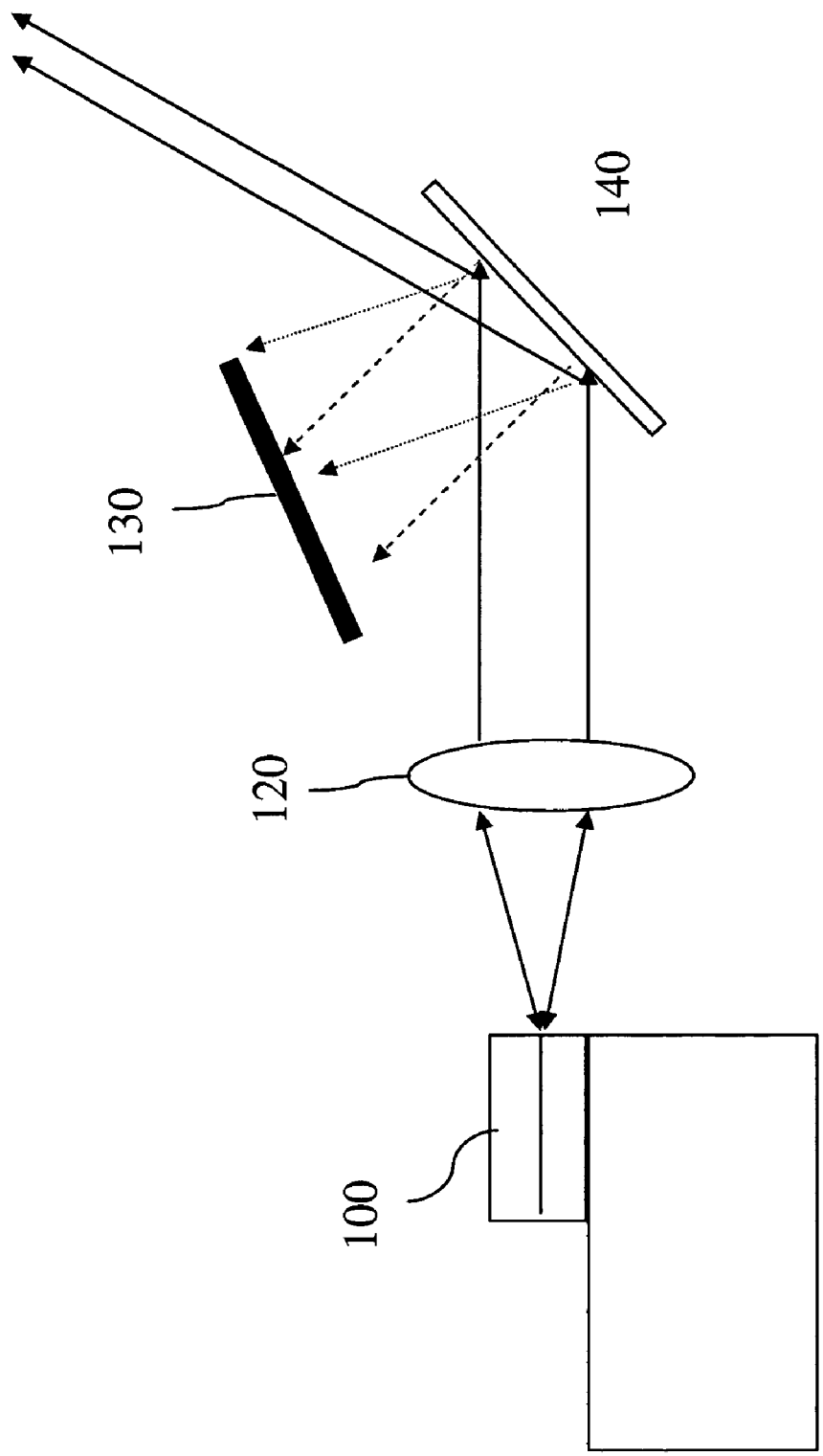
FIG. 1: (Prior Art): Schematic of a tunable laser apparatus containing a dispersive grating and a self-aligned retro-reflecting mirror.
Figure 2:
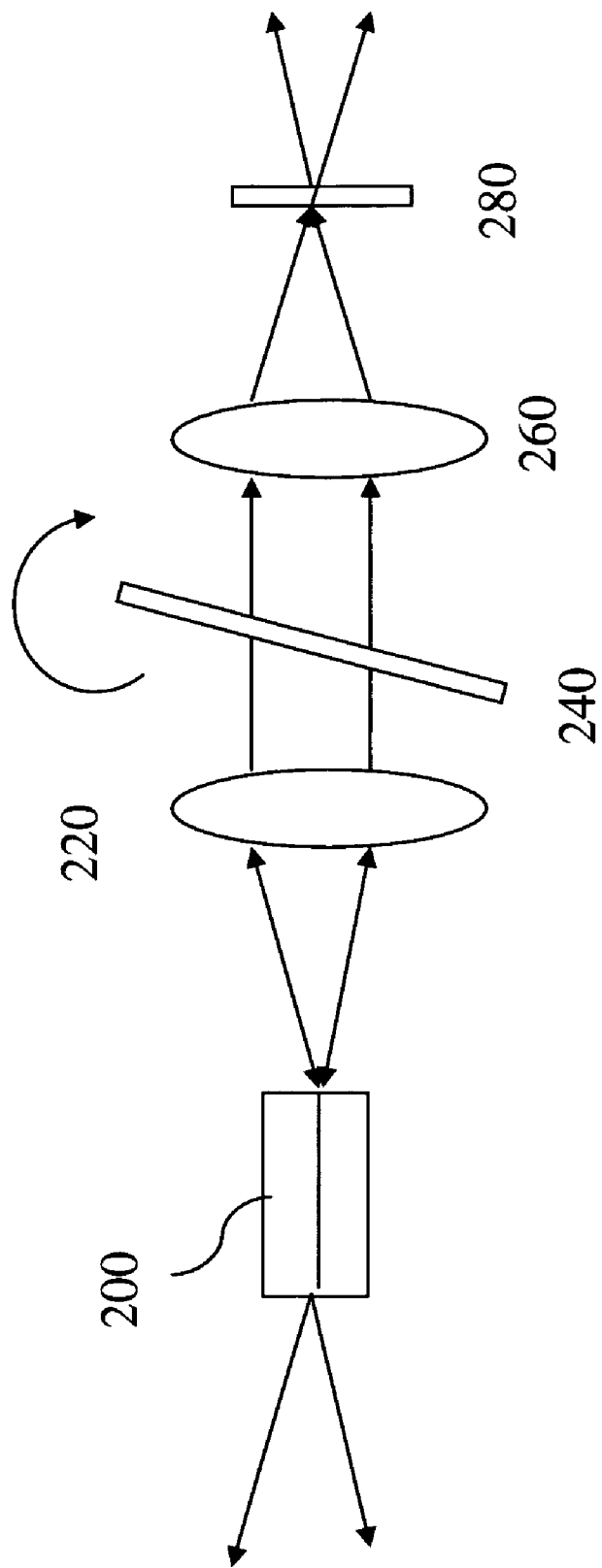
FIG. 2: (Prior Art): Schematic of a tunable laser apparatus containing an interference filter in a degenerate self-aligned cavity.
Figure 3:
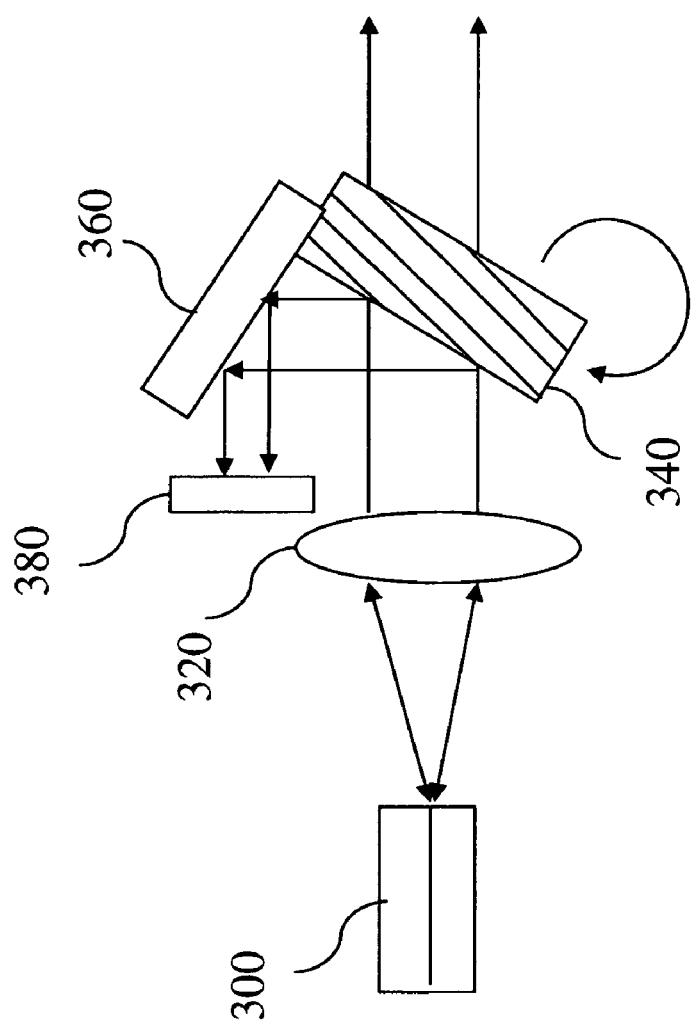
FIG. 3: Schematic of tunable laser apparatus containing a VHG.

The cavity length shown in FIG. 4 is approximately 4 times the focal length of the lens assembly 430. For comparison, the cavity length of Prior Art external cavities (FIG. 1, 2, 3) is approximately twice the focal length of a similar collimated assembly. Because of the folding configuration, the physical length of the external cavity laser is of the order of the focal length whereas the cavity length that determines the linewidth is 4 times as long. It is well known in the Art that the linewidth of external cavity semi-conductor lasers varies with the inverse of the square of the cavity length. Therefore, the embodiment disclosed in FIG. 4 provides a laser linewidth similar to prior art external cavity lasers but approximately 4 times more compact.

Figure 6:
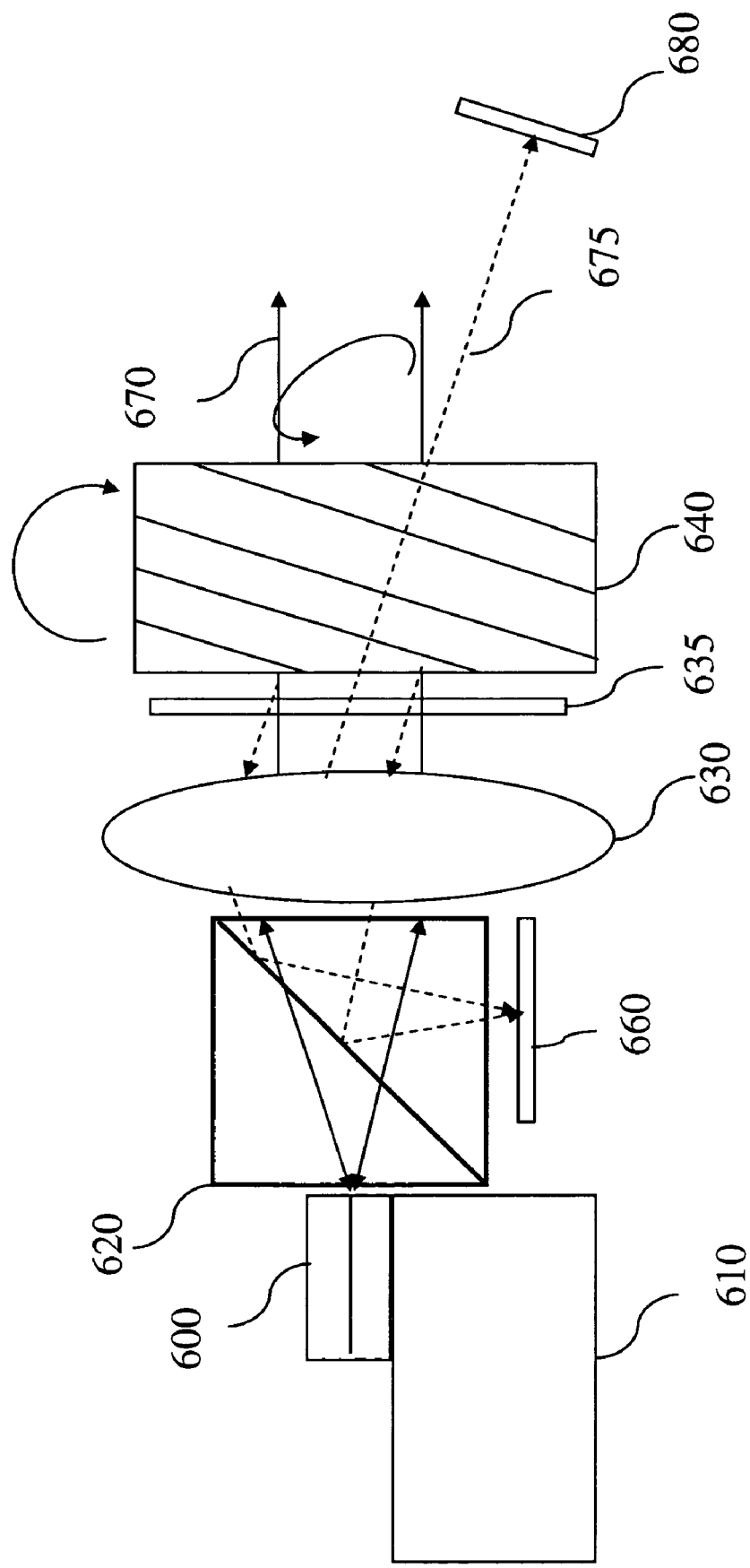
FIG. 6: Schematic of a tunable laser apparatus containing a VHG in a self-aligned degenerate cavity with a polarizing beam-splitter, quarter waveplate and a mirror positioned one focal length away from the collimated lens.

FIG. 6 is a schematic diagram of another embodiment. A laser diode 600 rests on a sub-carrier mount 610. The linear polarization light emitted from the laser diode 600 propagates through a polarizing beamsplitter 620 oriented in such a way as to transmit nearly 100% of the linear polarized beam. The diverging beam is then collimated by a single lens or lens assembly 630 to provide a first linear polarized collimated beam, which propagates through a quarter waveplate 635 to produce a first circularly polarized beam. A reflective VHG 640 is positioned in the path of the said first circularly polarized collimated beam so as to diffract (filter) said first circularly polarized collimated beam in a direction making a small angle with said first circularly polarized collimated beam.

The efficiency of the VHG can be chosen to be high or low depending on the feedback level sought. The part of the beam that is not diffracted goes through the VHG and forms a first output beam 670 of the cavity. The first circularly polarized diffracted beam propagates through the quarter wave plate 635 to produce a first linearly polarized diffracted beam whose polarization is orthogonal to the polarization of the first linearly polarized collimated beam. The first linearly polarized diffracted beam is then focused by the lens or lens assembly 630. The first linearly polarized diffracted beam is deflected by the polarizing beam-splitter 620 and focused onto a mirror 660 positioned at the focal plane of the lens assembly 630. Upon reflection on the mirror 660, the divergent beam is deflected a second time by the polarizing beam-splitter 620 and re-collimated by the lens assembly 630 to provide a second linearly polarized collimated beam. After propagating through the quarter wave plate 635, a second circularly polarized collimated beam is produced which propagates in the opposite direction as the first linearly polarized diffracted beam. Consequently the second circularly polarized collimated beam is diffracted by the VHG 640 to produce, after propagating through the waveplate 635, a second linearly-polarized diffracted beam whose polarization has the same direction as the first linearly polarized collimated beam and whose direction of propagation is opposite.

A second output beam 675 is produced as the result of the un-diffracted portion of the second circularly polarized collimated beam. A photodetector 680 maybe positioned in the path of the second output beam to receive output beam 675. The electrical signal generated from the photodetector maybe used for controlling the emission characteristics of the external cavity laser. For example the signal can be used to control the cavity length via a piezo-electric actuator (not shown) mounted on the VHG or in combination with the temperature and the current of the laser diode.

Tunability is achieved by rotating the VHG in either of two ways. In a first embodiment the VHG is rotated around an axis approximately perpendicular to the plane formed by the direction of the first collimated beam and the grating vector. In a second embodiment, the VHG, whose grating vector makes an angle with respect to the direction of the first collimated beam, is rotated around any axis going through the point formed by the intersection of the grating vector and the direction of the first collimated beam. Two axis of rotation will not tune the wavelength, namely the grating vector axis and the direction of the first collimated beam. It is well known that the wavelength of the diffracted beam depends on the angle of incidence. Both methods of rotation disclosed change the angle of incidence and therefore the diffracted wavelength. The tuning range is limited by the aperture of the lens assembly 630 and the lateral dimension of the beam-splitter 620 and mirror 660.

The laser cavity of FIG. 6 is called degenerate because the effective feedback into the cavity is insensitive to angular change and spatial motion of the VHG 640 and mirror 660.

Figure 7:
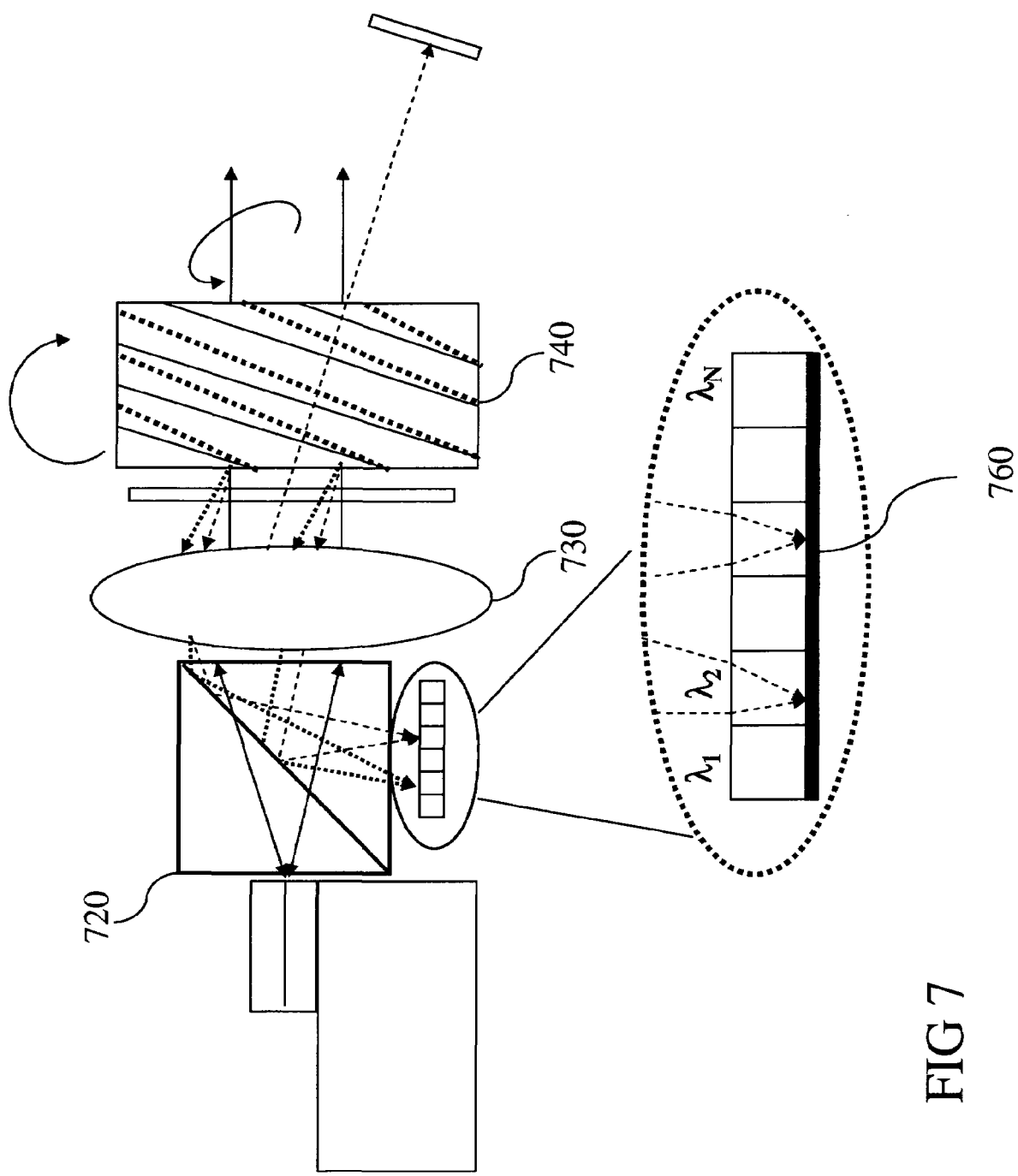
FIG. 7: Schematic of the tunable of FIG. 6 where the mirror is replaced by an array of liquid crystal (LC) cells and where the VHG has multiplexed gratings.

FIG. 7 is a schematic diagram of another embodiment which is a variation of the schematic diagram of FIG. 6. The difference between the schematic diagram of FIGS. 6 and 7 is the VHG 740 and the array of reflective liquid crystal cells 760 replacing the mirror 660 in FIG. 6. The VHG 740 in this embodiment consists of multiple reflective volume holographic gratings overlapping in the same volume. Each grating diffracts (filters) a specific wavelength in a specific direction.

The array of reflective liquid crystal cells 760 is positioned in the focal plane of the lens 730. Diffraction from the VHG containing N gratings produce N diffracted beams propagating at different angles and with different wavelengths. The N individual beams are simultaneously focused at different spatial cell locations on the reflective liquid crystal cells 760. The beam of on each cell has a specific distinct wavelength by design of the VHG 740. Activating a voltage on a liquid crystal cell rotates the polarization of the beam. By applying the appropriate voltage on the cell, the polarization of the beam reflected off the cell can be rotated by 90 degrees. In this case the polarizing beam-splitter 720 let the beam with the 90 degree rotated polarization go through and thus prevent feedback in the laser cavity. When no voltage is applied to a cell, the polarization of the reflected beam is not affected and the beam can contribute feedback to the laser as explained in the embodiment of FIG. 6. By applying the appropriate voltage to all cells but one, only a specific beam (i.e. wavelength) is fed-back into the cavity to generate a single mode longitudinal laser. Specific multimode longitudinal operation can be obtained by applying voltage to specific cells.

This cavity is therefore tunable by discrete wavelength steps by the disclosure above. By adding a slight rotation to the VHG such as described in the embodiment of FIG. 6, a continuous wavelength can be achieved. A piezo-electric actuator (not shown) on which the VHG 740 or liquid crystal cells 760 are mounted can add cavity length adjustment for mode hop free tuning.

Figure 8:
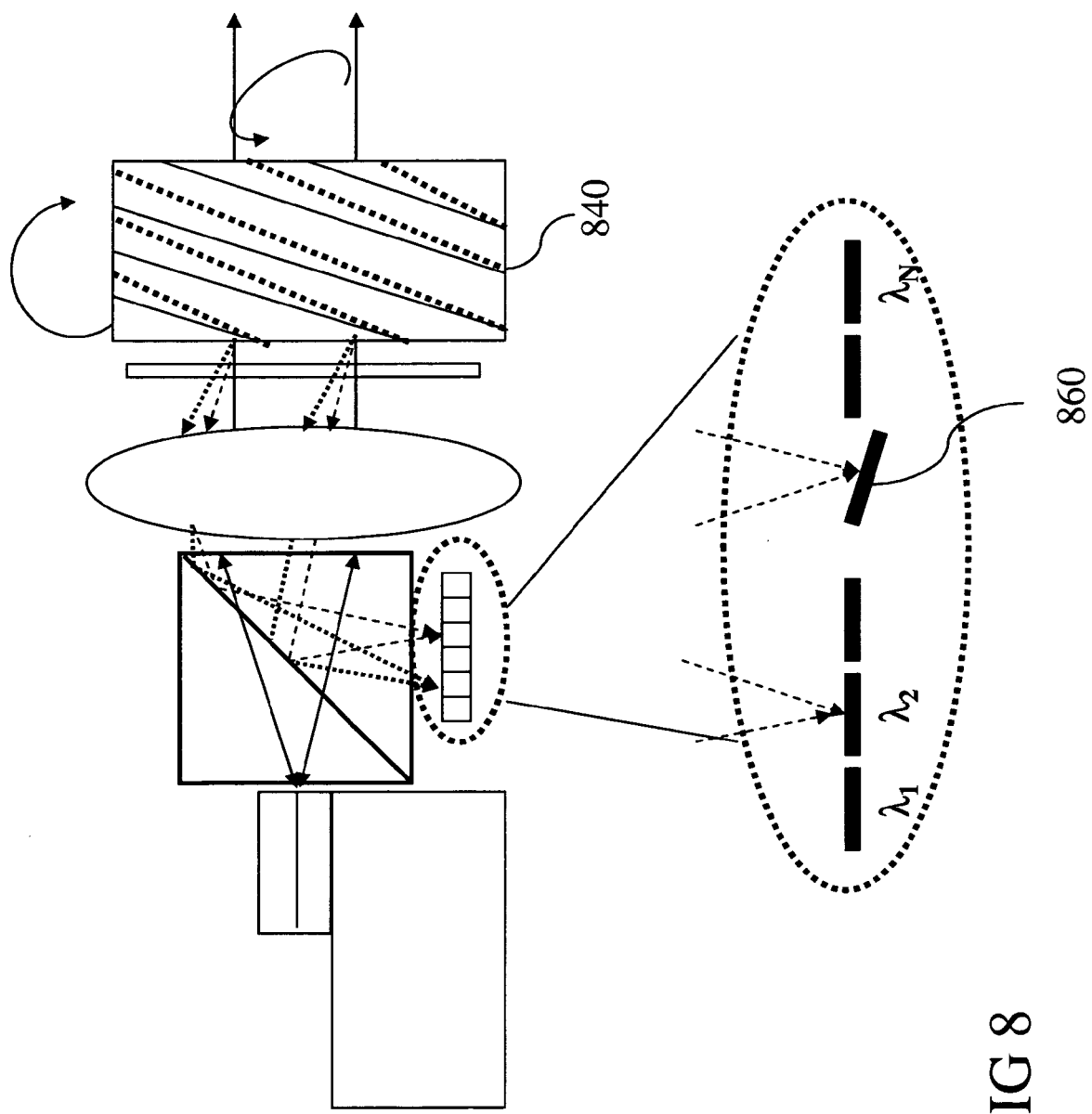
FIG. 8: Schematic of the tunable of FIG. 6 where the mirror is replaced by an array of switchable mirrors and where the VHG has multiplexed gratings.

FIG. 8 is a schematic diagram of another embodiment which is a variation of the embodiment of the schematic of FIG. 7 where the array of reflective liquid crystal cells 760 is replaced by an array of reflective mechanical electrical micromirrors 860 (MEMS). The MEMS 860 can either deflect the reflected beam in a direction such that the beam is blocked by the aperture of the components in FIG. 7 or other baffle apertures (not shown), so that the feedback in the cavity is prevented or the MEMS 860 can reflect the beams such that it provides feedback into the cavity according to the embodiments described in FIGS. 6 and 7.

Figure 9:
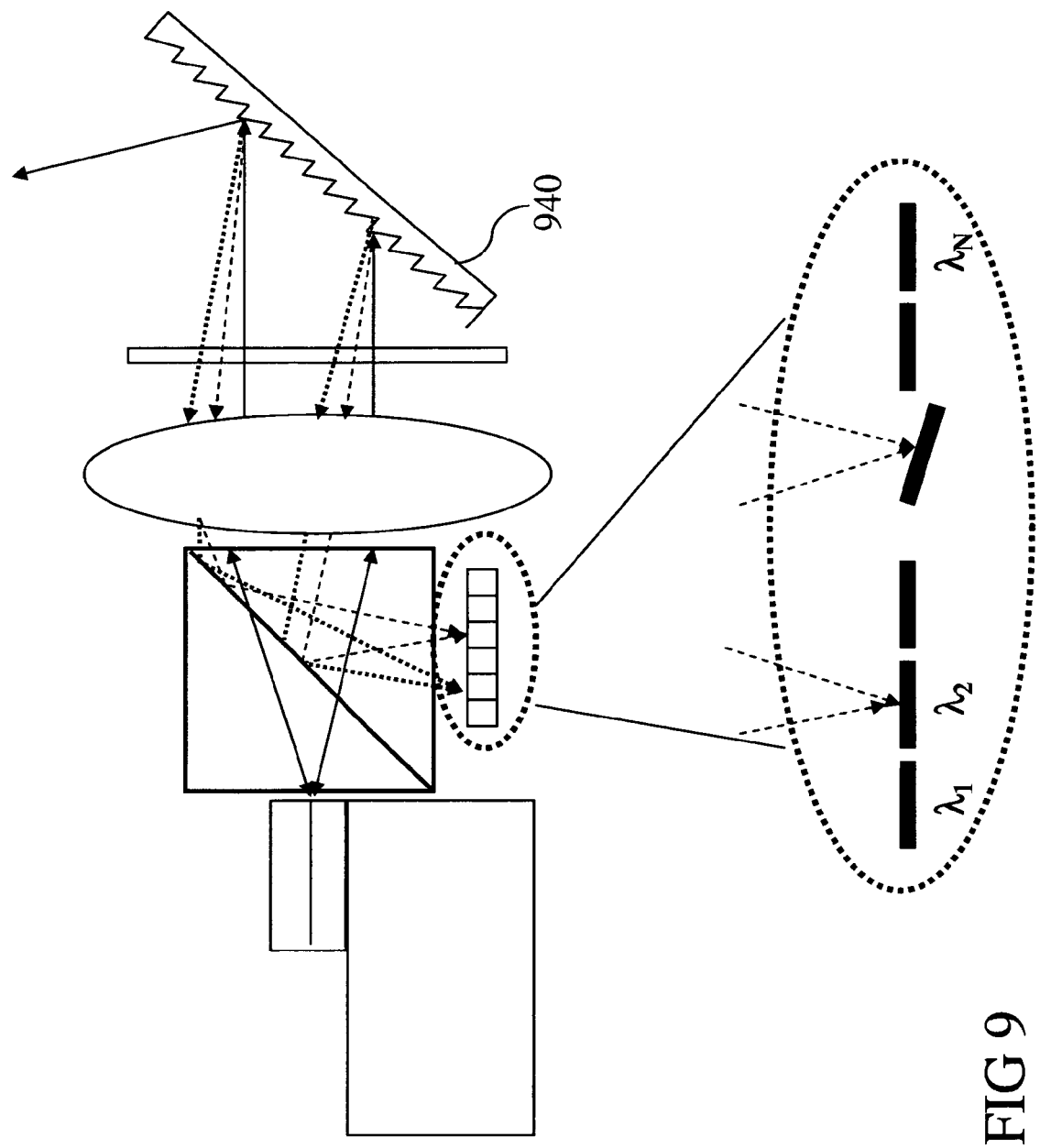
FIG. 9: Schematic of a tunable laser apparatus containing a dispersive grating in a self-aligned degenerate cavity with a polarizing beam-splitter, quarter waveplate and an array of switchable mirrors positioned one focal length away from the collimated lens.

FIG. 9 is a schematic diagram of another embodiment which is a variation of the embodiment of the schematic of FIG. 8 where the multiplexed VHG 840 is replaced by a dispersive grating such as a blazed relief grating FIG. 10 is an experimental measurement of the wavelength tuning using the schematic tunable architecture of FIG. 6. The graph shows the single mode wavelength in the y axis as a function of the angle of the VHG.

Figure 11:
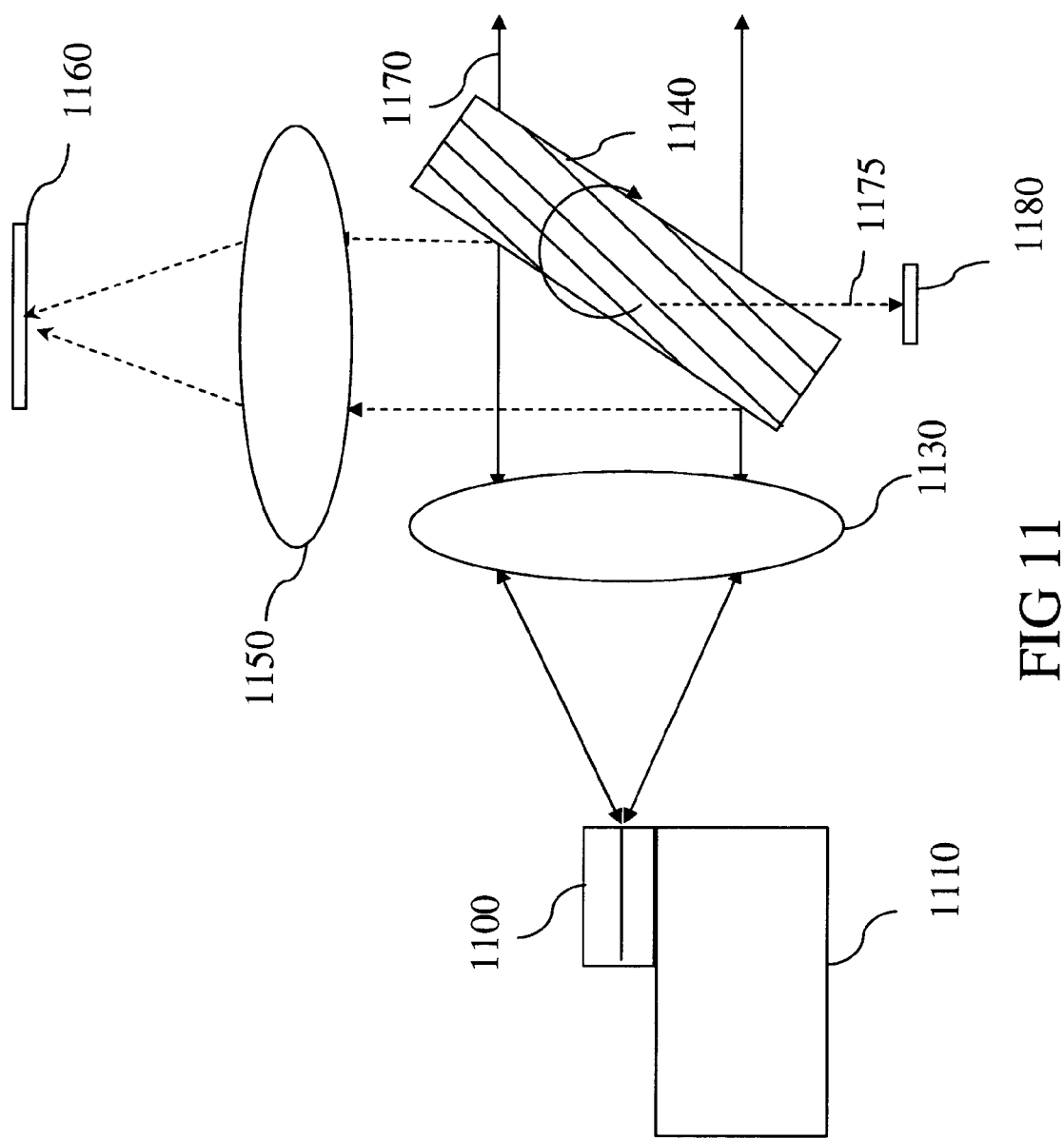
FIG. 11: Schematic of a tunable laser apparatus containing a VHG positioned approximately at 45 degrees in a self-aligned degenerate cavity with a second lens and a mirror placed one focal length away.

FIG. 11 is a schematic diagram of another embodiment of a tunable laser with a VHG in a degenerate self-aligned cavity. A laser diode 100 rests on a sub-carrier mount 1110. The light emitted from the laser diode is first collimated by a single lens or lens assembly 1130 to provide a first collimated beam. A reflective VHG 1140 is positioned in the path of the first collimated beam at angle approximately equal to 45 degrees with respect to the first collimated beam so as to diffract (filter) said first collimated beam to provide a first diffracted collimated beam propagating in a direction making approximately a right angle with the first collimated beam.

The efficiency of the VHG 1140 can be chosen to be high or low depending on the feedback level sought. The part of the beam that is not diffracted goes through the VHG and forms a first output beam 1170 of the cavity. The first collimated diffracted beam is focused by another lens assembly 1150 and focused onto a mirror 1160 placed at the focal plane of lens assembly 1150. Upon reflection the beam is re-collimated by lens assembly 1150 to provide a second collimated beam propagating in a direction opposite to the first collimated diffracted beam. The second collimated beam is diffracted by the VHG 1140 to provide a second collimated diffracted beam and a second output beam (the un-diffracted part of the beam) 1175 detected by photo-detector 1180. The second collimated diffracted beam propagates in a direction opposite the first collimated beam. By virtue of this self-alignment, the second collimated diffracted beam is focused by lens assembly 1130 into the laser diode emission facet 1100 which provides the wavelength selective feedback. Mirror 1160 can also be replaced by arrays of liquid crystal cells or array of MEMS such as described in embodiments of FIGS. 7 and 8 and the VHG 1140 can be replaced by a VHG with multiple gratings such as described in FIGS. 7 and 8.

Figure 12:
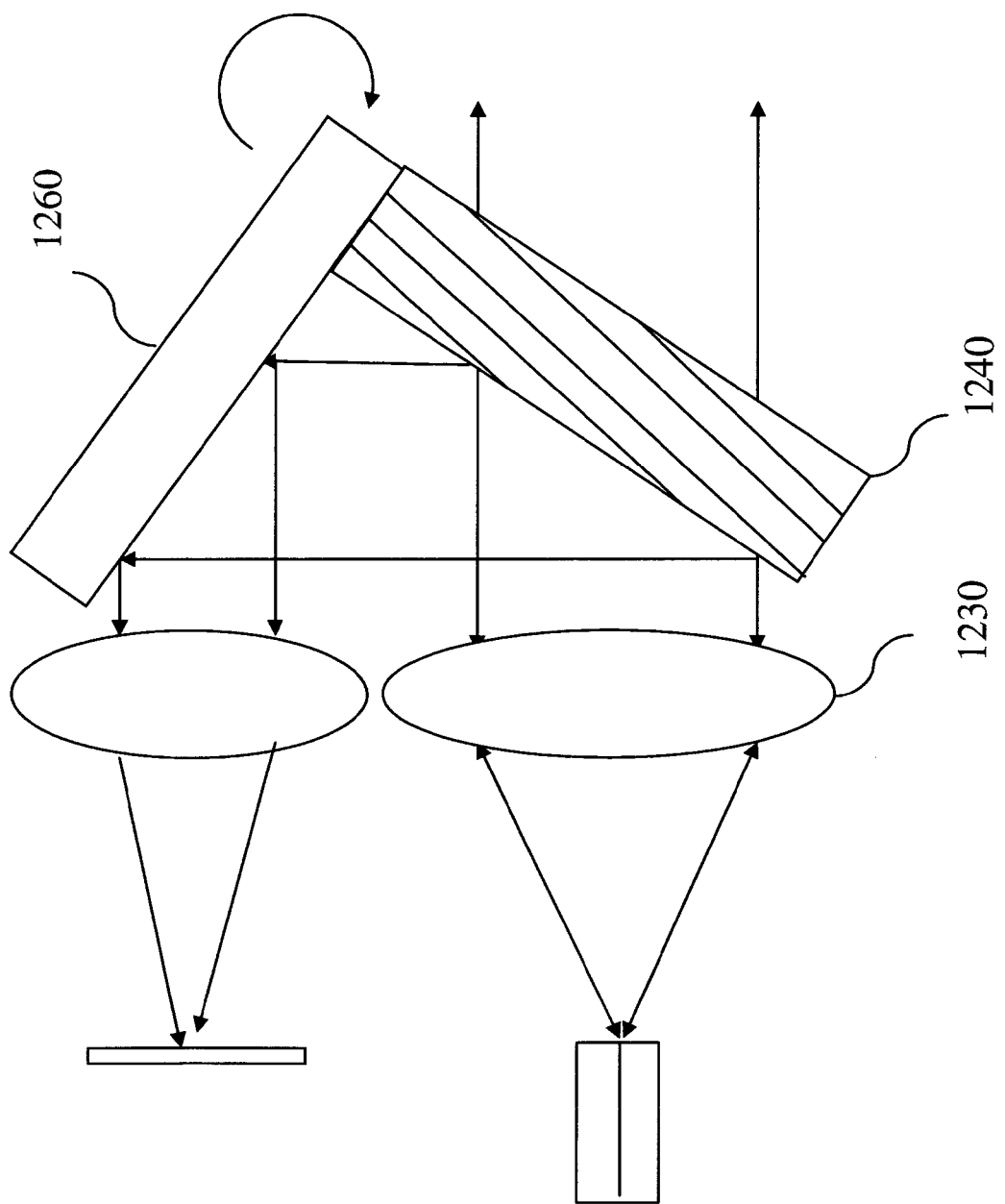
FIG. 12: Schematic of the tunable laser in FIG. 11, where a third planar mirror is positioned at right angle with the VHG to form a self-aligned degenerate cavity.

FIG. 12 is a schematic diagram of another embodiment, which is a variation of the embodiment in FIG. 11. An additional mirror 1260 is positioned at right angle with respect to the VHG 1240 so that wavelength tuning is performed by rotating the assembly composed of the mirror 1260 and the VHG 1240. By rotating this assembly the collimated beam reflected off the mirror 1260 is parallel to the collimated beam incident on the VHG 1240 and at the same time the wavelength is tuned.

Figure 13:
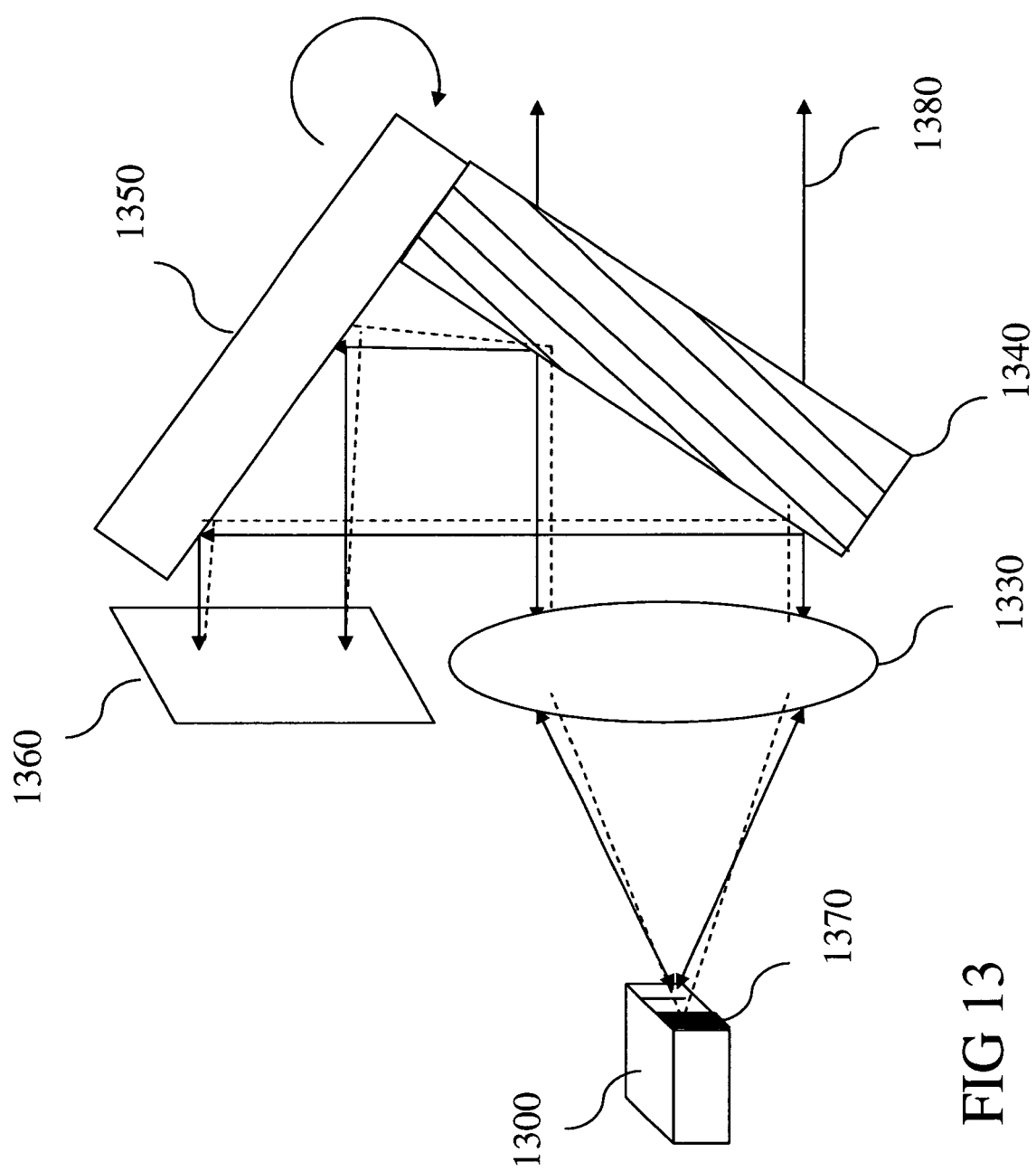
FIG. 13: Schematic of a tunable laser apparatus containing a VHG positioned approximately at 45 degrees, a right angle reflector arrangement and mirror positioned adjacent to the laser facet one focal length away form the lens to form a degenerate self-aligned cavity

FIG. 13 is a schematic of another embodiment of a tunable laser containing a VHG in a degenerate self-aligned cavity. The light emitted from the laser diode 1300 is first collimated by a single lens or lens assembly 1330 to provide a first collimated beam. A reflective VHG 1340 is positioned in the path of the said collimated beam at angle of approximately 45 degrees with the first collimated beam. The VHG 1340 diffracts (filters) the first collimated beam in a direction making approximately a right angle with the first collimated beam and provide a first diffracted collimated beam. The efficiency of the VHG 1340 can be chosen to be high or low depending on the feedback level sought. The part of the beam that is not diffracted goes through the VHG 1340 and forms a first output beam 1380 of the cavity. The first diffracted beam is reflected by mirror 1350 positioned at an approximately right angle with respect to the VHG 1340. The reflected beam off mirror 1350 propagates in a direction parallel and opposite to the first collimated beam. The reflected beam from mirror 1350 is again reflected by a second mirror 1360. The mirror 1360 is tilted around a rotation axis in the plane formed by the grating vector of the VHG 1340 and the collimated beam reflected off mirror 1350. The rotation axis is approximately orthogonal to the collimated beam reflected off mirror 1350. The collimated beam reflected off mirror 1360 and 1350 makes a small angle with the VHG in the off-Bragg direction. If the angle is small, the beam is still Bragg matched and thus re-diffracted by VHG 1340. The small angle in the off-Bragg direction provides a collimated beam that comes into a focus, after propagating through lens 1330, at a location in the focal plane slightly off the laser diode emission point 1300. A third mirror 1370 is positioned at this location to reflect the beam back onto itself.

On the second pass into the cavity, the beam is automatically fed-back into the laser cavity by diffracting on the VHG 1340 twice. The wavelength is tuned by rotating the VHG around an axis that is orthogonal to plane formed by the grating vector and the first collimated beam.

In embodiments described by FIGS. 4, 6, 7 and 8, the tuning characteristic can be made mode hop free with open loop. Wavelength tuning can be performed by rotating the VHG around an axis formed by the direction of the first collimated beam. Doing so changes the filter wavelength. By providing an arrangement by which upon rotating the VHG, the cavity length is simultaneously changed, for example by mounting the VHG on a threaded mount with appropriate thread pitch, in a way that the cavity modes are tracking exactly the wavelength change, the tuning can be made mode hop free and open loop.

Figure 14:
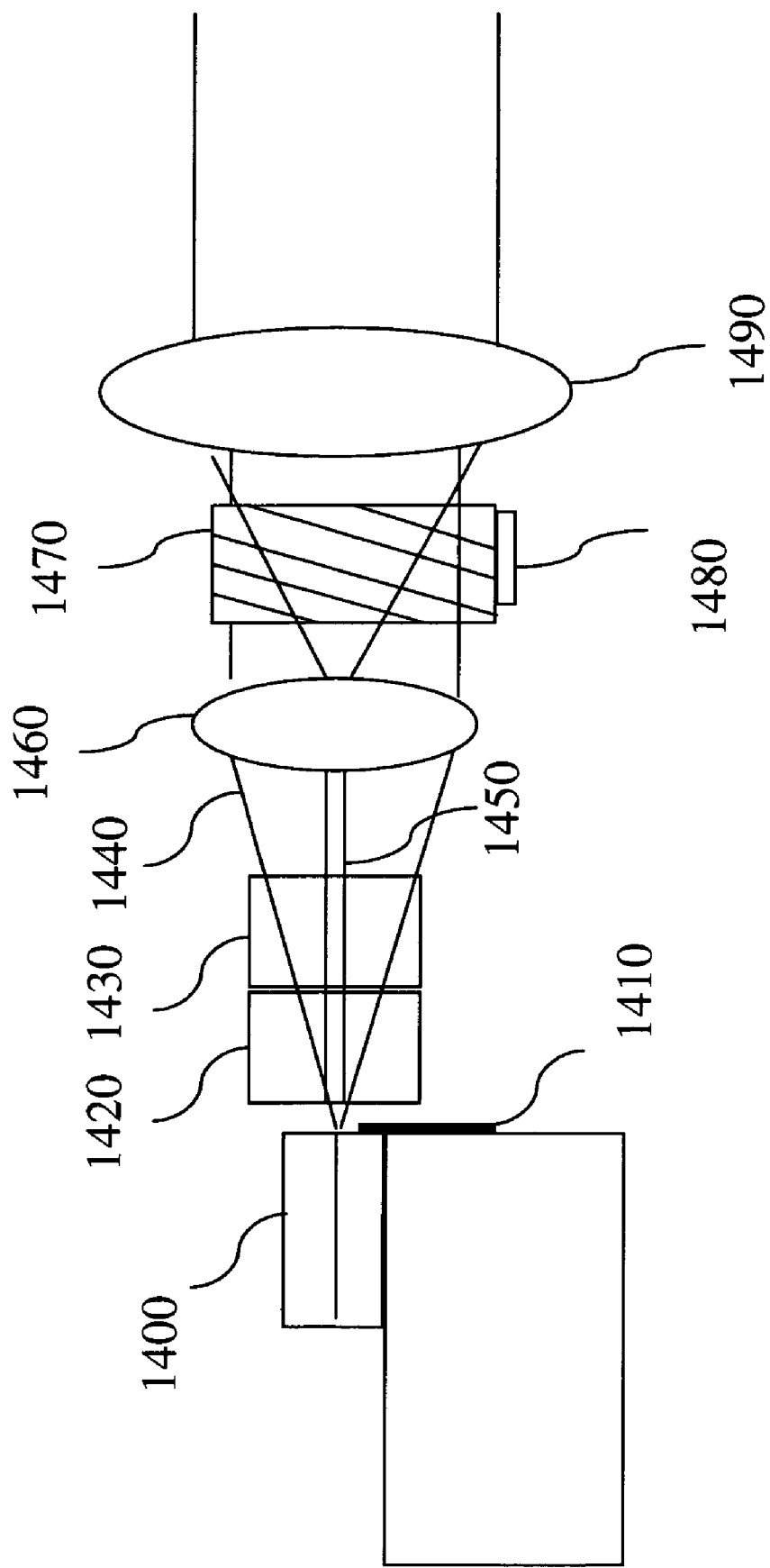
FIG. 14: Schematic of a degenerate self-aligned second harmonic cavity with a VHG and a mirror positioned adjacent to the laser facet one focal length away form the first lens.

FIG. 14 is a schematic of an embodiment of a degenerate self-aligned second harmonic cavity laser containing a VHG. The laser diode 1400 that optically pumps a laser gain material 1420, such as but not limited to YAG or Vanadate. The facet of the gain material 1420 facing the pump laser diode 1400 has a transparent coating for the pump source, such as but not limited to 808 nm, and a reflective coating for the fundamental and second harmonic laser wavelength, such as but not limited to 1064 nm and 532 nm. The opposite facet of the gain material 1420 has a transparent anti-reflection coating for the fundamental laser wavelength and the pump light.

A non-linear material 1430 is placed in closed proximity to the gain material 1420, as it is well known in art, for example if green laser pointers. The facet of the non-linear material 1430 facing the gain material 1420 has a high reflective coating at the second harmonic wavelength and low anti-reflective coating at the fundamental wavelength. The opposite facet of the non-linear material 1430 has a low reflective coating for the second harmonic wavelength and a high reflective coating at the fundamental wavelength. The assembly comprised of the laser diode 1400, the gain material 1420 and the non-linear material 1430 is well known in the art.

The gain material 1420 pumped by the laser diode 1400 generates light at the fundamental wavelength. Said fundamental light resonates in the cavity formed by the front facet of the gain material 1420 and the exit facet of the non-linear material 1430. The non-linear material 1430 converts said fundamental light to the second harmonic, which propagates in the same direction as the fundamental beam. A beam expander is formed by assembly lens 1460 and assembly lens 1490 to increase the collimated size of the fundamental beam 1450. The focal length of the lens assembly 1460 is such that is collimates the portion of the laser diode pump light 1440 that has not been absorbed by the gain material 1420. A reflective VHG 1470 receives the collimated pump beam and diffracts (filters) the collimated pump beam to generate a first diffracted beam at an angle slightly different than the propagation direction of the collimated pump beam. A mirror 1410 is positioned one focal length away from lens 1460 and positioned adjacent to the laser diode emitter to reflect the focused first diffracted beam. The light reflected from mirror 1410 is re-diffracted by the VHG 1470 to produce a second diffracted beam propagating in the opposite direction as the first collimated beam. The second diffracted beam is by design automatically aligned to feedback in to the laser diode facet 1400.

The laser device in this embodiment features a broader temperature range of operation than the prior art because the pump light, whose wavelength depends on temperature, is locked to the wavelength of the VHG, which has a much smaller temperature variation with temperature. By locking the wavelength in temperature, the laser diode can pump the gain material at the peak of its absorption range and thus enhances the efficiency and extend the temperature range.

A detector 1480 is placed next to one facet of the VHG 1470 so as to not obstruct the beam and to detect the second harmonic light via the scattered light from the VHG 1470. The detector signal can be used to control the power of the laser diode pump in order to keep a constant second harmonic power output.

Figure 15:
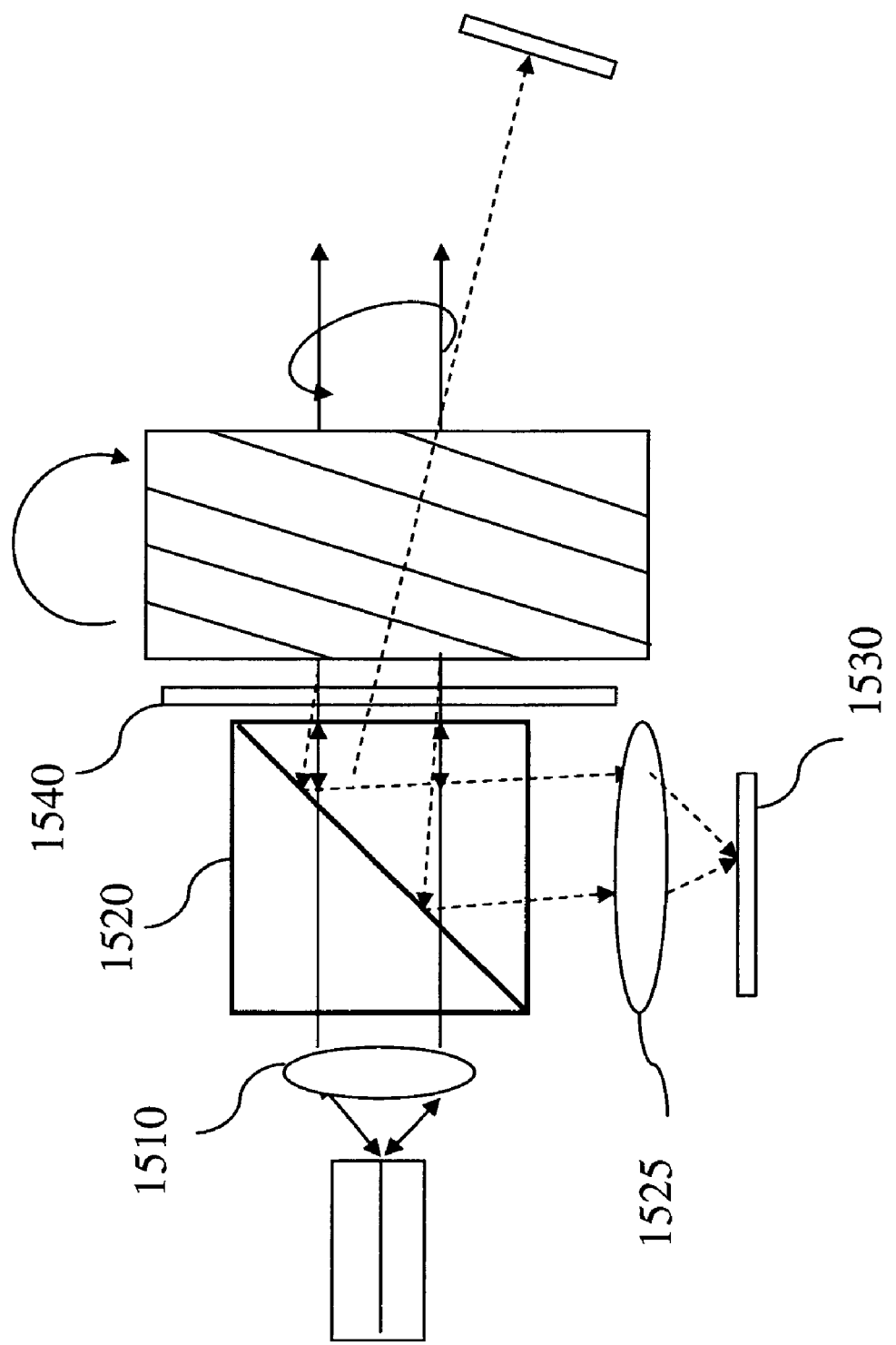
FIG. 15: Schematic of a tunable laser apparatus containing a VHG in a self-aligned degenerate cavity with a polarizing beam-splitter, quarter waveplate and a lens-mirror assembly for retro-reflector.
Figure 16:
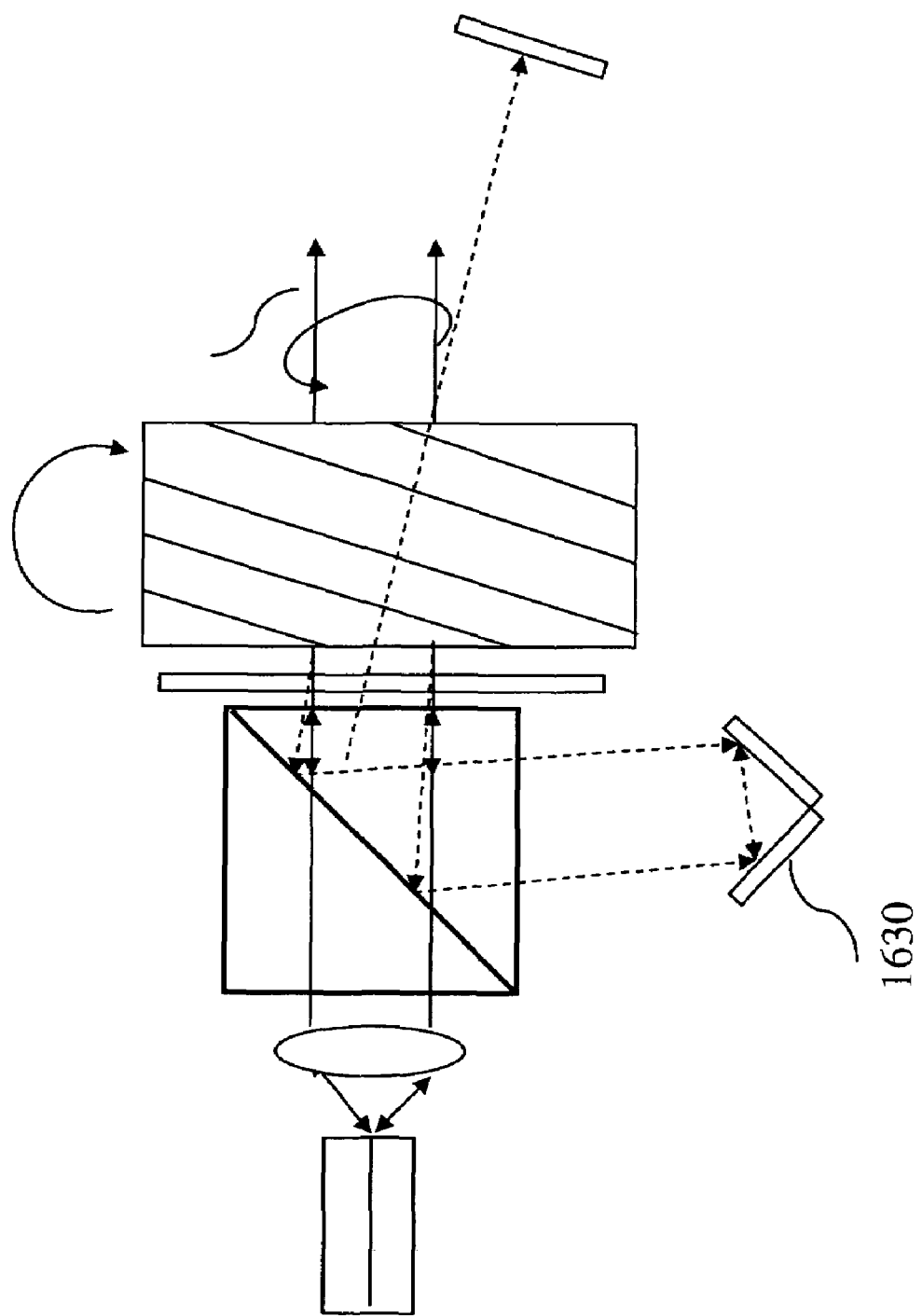
FIG. 16: Schematic of a tunable laser apparatus containing a VHG in a self-aligned degenerate cavity with a polarizing beam-splitter, quarter waveplate and "cat-eye" retro-reflector.

FIGS. 15 and 16 are schematics of another embodiment, which is a variation of the embodiment of FIG. 6. In FIG. 15, the main difference is that the polarizing beam-splitter 1520 and quarter waveplate 1530 are positioned after the lens collimation assembly 1510 rather than before the lens assembly as it is described in FIG. 6. A reflecting assembly composed of a second lens assembly 1525 and a reflecting mirror 1530 positioned at the focal plane of the second lens assembly performs the function of mirror 660 in FIG. 6. In FIG. 16, the reflecting assembly is composed of a retro-reflector 1630 such as for example a corner cube reflector or prism reflector.

The invention claimed is:

1. A laser source tunable in wavelength with a degenerate self-aligned external cavity comprising:
  an amplifier waveguided medium placed inside the external cavity,
  a lens assembly to collimate the light from said waveguide amplifier,
  a reflective volume holographic grating element as the output coupler and the wavelength selective component of the external cavity wherein,
    said volume holographic grating element has a grating vector substantially non-parallel with respect to the first collimated beam and receives a first and second collimated beam and generates a first and second filtered beam wherein,
      the first filtered beam is propagating in a direction opposite and substantially non-parallel with respect to the first collimated beam and the second filtered beam is propagating in a direction opposite and substantially parallel to said first collimated beam and providing optical feedback to said waveguide amplifier,
  a mirror positioned adjacent to said waveguide amplifier wherein,
    the reflective facet of the mirror is placed at the focal plane of said lens assembly and which receives and reflects said first filtered beam to produce said second collimated beam after collimation from said lens assembly wherein,
      said second collimated beam produces said second filtered beam upon diffraction from said volume holographic grating element.

2. The tunable laser of claim 1, wherein the waveguide amplifier medium is a fiber.

3. The tunable laser of claim 1, wherein the waveguide is a single spatial mode semi-conductor laser diode.

4. The tunable laser of claim 1, wherein the waveguide is a broad area semi-conductor laser diode.

5. The tunable laser of claim 1, wherein the waveguide is an array of broad area semi-conductor laser diode.

6. The tunable laser of claim 1, wherein the lens assembly is a combination of a fast axis lens and slow axis lens.

7. The tunable laser of claim 1, wherein the lens assembly is any combination of aspherical lenses, achromatic lenses, cylindrical lenses, aspherical cylindrical lenses, ball lenses, grin lenses.

8. The tunable laser of claim 1, wherein the lens assembly is a combination of a fast axis lens and a slow axis lens.

9. The tunable laser of claim 1, wherein the reflective volume holographic grating element is made of photosensitive glass.

10. The tunable laser of claim 1, wherein the reflective volume holographic grating element is rotated around any axis which is neither parallel to said first collimated beam axis nor parallel to grating vector to said holographic grating element.

11. A laser source tunable in wavelength with a degenerate self-aligned external cavity comprising:
  an amplifier waveguided medium placed inside the external cavity,
  a lens assembly defining an optical axis to collimate the light from the waveguide amplifier to produce a first collimated beam,
  a polarizing beam-splitter,
  a quarter-wave plate,
  a reflective volume holographic grating element as the output coupler and the wavelength selective component of the external cavity wherein
    said volume holographic grating element first receives said first collimated beam and generates a plurality of filtered beams propagating in a direction opposite and substantially non-parallel with respect to said first collimated beam,
  a reflecting assembly receiving said plurality of filtered beams reflected from said polarizing beam-splitter and producing a second subset of at least one collimated beam after reflection from said polarizing beam-splitter and collimation from said lens assembly wherein,
    said second subset of at least one collimated beam produces a second subset of at least one filtered beam upon diffraction from said volume holographic grating element, wherein
      second subset of at least one filtered beam propagates in a direction substantially parallel to first collimated beam and produces optical feedback into said amplifier waveguided medium.

12. The tunable laser of claim 11, wherein the waveguide amplifier medium is a fiber.

13. The tunable laser of claim 11, wherein the waveguide is a single spatial mode semi-conductor laser diode.

14. The tunable laser of claim 11, wherein the waveguide is a broad area semi-conductor laser diode.

15. The tunable laser of claim 11, wherein the waveguide is an array of broad area semi-conductor laser diode.

16. The tunable laser of claim 11, wherein the lens assembly is any combination of aspherical lenses, achromatic lenses, cylindrical lenses, aspherical cylindrical lenses, ball lenses, grin lenses.

17. The tunable laser of claim 11, wherein the lens assembly is a combination of a fast axis lens and a slow axis lens.

18. The tunable laser of claim 11, wherein the reflective volume holographic grating element is made of photosensitive glass.

19. The tunable laser of claim 11, wherein the reflective volume holographic grating element contains one of more overlapped reflective volume gratings each with distinct grating vector.

20. The tunable laser of claim 11, wherein the reflective volume holographic grating element is rotated around any axis which is neither parallel to said first collimated beam axis nor parallel to grating vector to said holographic grating element.

21. The tunable laser of claim 11, wherein the reflecting assembly is a mirror element which is either a planar mirror, an array of reflecting liquid crystal cells or an array of micromirrors positioned at the focal plane of the lens assembly where said plurality of filtered beams comes into a focus.

22. The tunable laser of claim 11, wherein the reflecting assembly is a retro-reflector corner cube or retro-reflector prism element positioned after first lens assembly.

23. The tunable laser of claim 11, wherein the reflecting assembly is positioned after first lens assembly and wherein, the reflecting assembly is formed by a second focusing lens and a mirror element, wherein, the mirror element is either a planar mirror, an array of reflecting liquid crystal cells or an array of micromirrors positioned at the focal plane of said second focusing lens where said plurality of filtered beams comes into a focus.

24. A laser source tunable in wavelength with a degenerate self-aligned external cavity comprising:

an amplifier waveguided medium placed inside the external cavity, a first lens assembly defining an optical axis to collimate the light from the waveguide amplifier to produce a first collimated beam, a reflective volume holographic grating element as the output coupler and the wavelength selective component of the external cavity wherein, said volume holographic grating element first receives said first collimated beam and generates a plurality of filtered beams propagating in a direction substantially non-parallel with respect to said first collimated beam, a reflecting assembly receiving said plurality of filtered beams and producing a second subset of at least one collimated beam wherein, said second subset of at least one collimated beam produces a second subset of at least one filtered beam upon diffraction from said volume holographic grating element, wherein second subset of at least one filtered beam propagates in a direction substantially parallel to first collimated beam and produces optical feedback into said amplifier waveguided medium.

25. The tunable laser of claim 24, wherein the waveguide amplifier medium is a fiber.

26. The tunable laser of claim 24, wherein the waveguide is a single spatial mode semi-conductor laser diode.

27. The tunable laser of claim 24, wherein the waveguide is a broad area semi-conductor laser diode.

28. The tunable laser of claim 24, wherein the waveguide is an array of broad area semi-conductor laser diode.

29. The tunable laser of claim 24, wherein the lens assembly is any combination of aspherical lenses, achromatic lenses, cylindrical lenses, aspherical cylindrical lenses, ball lenses, grin lenses.

30. The tunable laser of claim 24, wherein the lens assembly is a combination of a fast axis lens and a slow axis lens.

31. The tunable laser of claim 24, wherein the reflective volume holographic grating element is made of photosensitive glass.

32. The tunable laser of claim 24, wherein the reflective volume holographic grating element contains one of more overlapped reflective gratings each with distinct grating vector.

33. The tunable laser of claim 24, wherein the reflective volume holographic grating element is rotated around an axis orthogonal to the plane defined by said first collimated beam and a grating vector from said reflective volume holographic element.

34. The tunable laser of claim 24, wherein the reflecting assembly is a retro-reflector corner cube or retro-reflector prism element positioned after first lens assembly.

35. The tunable laser of claim 24, wherein the reflecting assembly is positioned after first lens assembly and wherein, The reflecting assembly is formed by a second focusing lens and a mirror element, wherein, the mirror element is either a planar mirror, an array of reflecting liquid crystal cells or an array of micromirrors positioned at the focal plane of said second focusing lens where said plurality of filtered beams comes into a focus.

36. A second harmonic laser source comprising:

a pump laser diode source, an amplifier medium whose facet facing said pump laser diode forms one side of the fundamental cavity, a non-linear material to generate second harmonic light positioned adjacent to said amplifier medium whose facet opposite said amplifier medium is the output coupler of the fundamental cavity, a first lens assembly to collimate the light from said pump laser diode, a reflective volume holographic grating element as the output coupler of the external cavity of said pump laser diode source and the wavelength selective component of the pump external cavity wherein said grating element receives a first and second collimated beam from said laser diode pump and generates a first and second filtered beam wherein the first filtered beam is propagating in a direction opposite and substantially non-parallel to the first collimated beam and the second filtered beam is propagating in direction opposite and substantially parallel to said first collimated beam and provides optical feedback to said laser diode pump, a mirror positioned adjacent to said laser diode pump whose reflective facet is placed at the focal plane of said first lens assembly and which receives and reflects said first filtered beam to produce a second collimated beam after collimation from said lens assembly, wherein second collimate beam produces said second filtered beam upon diffraction from said volume holographic grating element, a second lens assembly to form a beam expander with first lens assembly for the second harmonic light.

37. The tunable laser of claim 36, wherein the laser pump diode is a single spatial mode semi-conductor laser diode.

38. The tunable laser of claim 36, wherein the laser pump diode is a broad area semi-conductor laser diode.

39. The tunable laser of claim 36, wherein the pump diode is an array of broad area semi-conductor laser diode.

40. The tunable laser of claim 36, wherein the reflective volume holographic grating element is made of photosensitive glass.

41. The tunable laser of claim 36, wherein the reflective volume holographic grating element contains one of more overlapped reflective gratings each with distinct grating vector.

* * * * *